United States Patent [19]
Il'Yashenko et al.

[11] Patent Number: 6,143,435
[45] Date of Patent: Nov. 7, 2000

[54] MAGNETO-OPTICAL THIN-LAYER STRUCTURE

[75] Inventors: Eugene Ivanotitch Il'Yashenko, Moscow; Valentina Prokofiena Klin; Alexander Gennadievicj Soloviev, both of Kaluga, all of Russian Federation

[73] Assignee: Garnatec, Berkshire, United Kingdom

[21] Appl. No.: 08/842,286

[22] Filed: Apr. 23, 1997

[30] Foreign Application Priority Data

Apr. 23, 1996 [RU] Russian Federation ............. 96107470

[51] Int. Cl.[7] .............................. G11B 5/64; H01F 10/24; H01F 10/26
[52] U.S. Cl. ........................................ 428/694 GT; 369/13
[58] Field of Search ............................... 428/693, 694 GT, 428/694 RM, 694 SC, 338; 369/13, 283, 288; 359/280, 282, 284; 350/377, 376

[56] References Cited

U.S. PATENT DOCUMENTS

| | | | |
|---|---|---|---|
| 4,625,390 | 12/1986 | Shone et al. | 29/576 B |
| 4,893,909 | 1/1990 | Hansen et al. | 350/377 |
| 5,463,316 | 10/1995 | Shirai et al. | 324/244.1 |
| 5,473,466 | 12/1995 | Tanielian et al. | 359/282 |

FOREIGN PATENT DOCUMENTS 63-035421  2/1988  Japan .
7-069797  3/1995  Japan .

OTHER PUBLICATIONS

Papakonstantinou et al., J. Mag. Mag. Mat. 163 (1996), pp. 378–392, (no month).

*Primary Examiner*—Deborah Jones
*Assistant Examiner*—Michael LaVilla
*Attorney, Agent, or Firm*—Michael A. Glenn

[57] ABSTRACT

The invention relates to magneto-optical structures applicable in systems for optical processing of information, in sensors and converters of magnetic field. The technical result is comprised in increase of resolution and sensitivity, ensuring high value of Faraday rotation of polarized light and high speed of operation when pulses of external magnetic field are applied. In the magneto-optical structure, comprised of underlay 1 formed of a mono-crystal of gadolinium-gallium ferrite-garnet, on which deposed is a film 2 of bismuth containing gallium ferrite-garnet with vector 3 of magnetization lying in the plane of the film, crystallographic axis [100] 5 of the underlay mono-crystal 1 is offset relative to the perpendicular 4 to the underlay plane at an angle not exceeding the magnitude of deflection to the crystallographic axis [210] 6, preferably in the range from 0 deg to 4 deg inclusive, and the bismuth containing ferrite-garnet is doped with rare-earth elements, preferably thulium, gadolinium, lutetium or their combinations.

4 Claims, 2 Drawing Sheets

MAGNETO-OPTICAL THIN-LAYER STRUCTURE

BACKGROUND OF THE INVENTION

The invention relates to magneto-optical structures designated to application in systems for optical processing of information, and can be utilized for building sensors, converters of magnetic field, and other devices of similar purpose.

At the present time, ferrite-garnet materials containing bismuth in form of thin or multi-layer films (foils) are widely known, and are used for visualization and observation of magnetic fields.

In particular, epitaxial films containing bismuth are used for observation of magnetic fields from various sources, as well as for processing of information in magneto-optical devices and systems [1,2]. Such epitaxial films are structures grown on mono-crystalline underlay of gadolinium gallium garnet (GGG) having their crystallographic orientation in the usual plane [111], [110] or [210].

Well known are magneto-optical films with garnet structure of $(Bi,Y,Tm,Gd)_3(Fe,Ga)_5O_{12}$, applicable to display devices, optical devices for data processing, and storage components [3]. As presented on FIG. 1, such film 1, epitaxially grown on a GGG underlay 2 with [111] orientation, has a mono-axial anisotropy directed along orientation line [111]. The faraday rotation coefficient of such a film, measured with a going-through 546.1 nanometer wavelength light, is of the order of 3 deg/micrometer. Such a film exhibits a B-H hysteresis of the Faraday rotation as a function of the field applied along the [111] axis. The field magnitude, required for switching the film between opposite saturation states, varies in the range of 30–400 E.

A film, similar to the one presented by FIG. 1, has mono-axial direction of magnetization, i.e. vector 3 of the magnetization is oriented perpendicular to the film plane. Characteristic of such films is the "labyrinth" domain structure, schematically presented on FIG. 1. It forms in absence of external magnetic field $H_{ext}$, perpendicular to the film plane, or when such field is weak.

When external field $H_{ext}$ of sufficient level is applied to film 1, its domain structure changes, approximately representing the form of the magnetic flux coming from the corresponding source. This is the base principle of visualization of magnetic field using ferrite-garnet films containing bismuth. Inclusion of bismuth in the composition of the ferrite-garnet film improves its magneto-optical properties. The relatively low resolution of such films, the limited resolution caused by the width of stripe domains, can be considered a disadvantage. The width of stripe domains can be reduced by increasing the saturation magnetization $4PM_s$ of the film. This, however, results in strong reduction of sensitivity of such film to the external magnetic field $H_{ext}$. The saturation magnetization $4PM_s$ can also be increased by reducing the thickness of the film. Such approach, however, leads to the reduction of Faraday rotation of polarized light vector making observation of the visualized magnetic field difficult. Resolution achieved with mono-axial ferrite-garnet films containing bismuth is not better than 1.2 micrometers for magnetic field sources having signal/noise ratio in the range of 45–50 dB.

Also known are magneto-optical structures with bismuth containing ferrite-garnet films, in which magnetization vector M is oriented along the film plane, so called films with "easy plane" [4,5]. Such a structure is schematically presented on FIG. 2. Usually a GGG mono-crystal or GGG with complex substitution by Ca Mg Zr, or any other mono-crystalline dielectric material with similar crystal parameters of crystal lattice serves as underlay 2 for such a film. Orientation of the underlay for ferrite-garnet films with "easy plane" of magnetization can be [111], [210], or [100]. Under influence of perpendicular component of the external magnetic field $H_{1ext}$ the vector 3 of magnetization M deflects from the film plane at certain angle which depends on the magnitude of the external field $H_{1ext}$. The angle of Faraday rotation of light polarization vector is proportional to the angle between M and the film plane, and proportional to the $H_{1ext}$.

The main advantages of films with "easy plane" are high resolution and capability to achieve deep optical modulation, i.e. to obtain higher contrast image of the magnetic field. This capability is bound to the higher values of the Faraday rotation. However, in order to achieve such values it is necessary to introduce higher number of bismuth ions into the crystallographic lattice of the film. On the other hand, increasing the number of bismuth ions increases anisotropy of the field $H_a$ of the ferrite-garnet film and, in result, raises the value of the $H_{1ext}$ field necessary for obtaining the desired angle of vector M rotation. In the other words, sensitivity of the film goes down. Furthermore, in result of introducing bismuth ions in the film composition above certain number, the film becomes mono-axial.

SUMMARY OF THE INVENTION

The purpose of the invention is to create a magneto-optical structure, primarily for utilization in sensors of magnetic fields, capable of overcoming the disadvantages of the analogous structures known in the previous level of technology. The achievable technical result of the invention should be improvement of resolution and sensitivity, providing a high value of Faraday rotation of a polarized light, and high speed of operation when the external magnetic field has a pulse form.

The desired result is achieved in a way, in which a magneto-optical thin-film structure has an underlay of garnet structure, on which deposited is a film of a magnetic material magnetization vector of which lies in the film plane, with a bismuth containing gallium ferrite-garnet chosen as the film material; the structure distinct by the fact that the underlay is formed from a mono-crystalline gadolinium gallium garnet, crystallographic axis [100] of which is offset with respect to the perpendicular to the underlay plane and, correspondingly, with respect to the plane of the film of the ferrite-garnet containing bismuth by the angle A, which doesn't exceed the magnitude of deflection from the direction of the crystallographic axis [210], and with the ferrite-garnet containing bismuth doped with rare-art elements.

At the same time, the angle A, between crystallographic axis [100] of the mono-crystalline underlay and the perpendicular to the plane of the underlay with the film of bismuth containing ferrite-garnet, which is measured in direction towards the crystallographic axis [210] of the underlay mono-crystal, is preferably chosen in the range 0 deg<A<=4 deg.

In addition, as the doping rare-earth elements may be chosen the elements from the group comprised of thulium, lutetium and gadolinium either separately or their combinations. Finally, the magnetic material of the film preferably contains 0.8 to 0.85 bismuth ions and 1.1 to 1.15 gallium ions per each formulary unit of the crystalline structure of the aforementioned material.

DRAWINGS

The invention is explained with the charts presenting the following:

DETAILED DESCRIPTION

Assumptions, according to the invention, regarding orientation of the underlay and composition of the layer deposited on it, the magnetic material film, ensure optimal parameters for anisotropy field $H_a$, saturation magnetization $4PM_s$, Faraday rotation coefficient $Q_F$, and magnetic Q factor $Q=2H_a/4PM_s$, preserving minimal values of $H_a$ and $4PM_s$.

Figure 3:
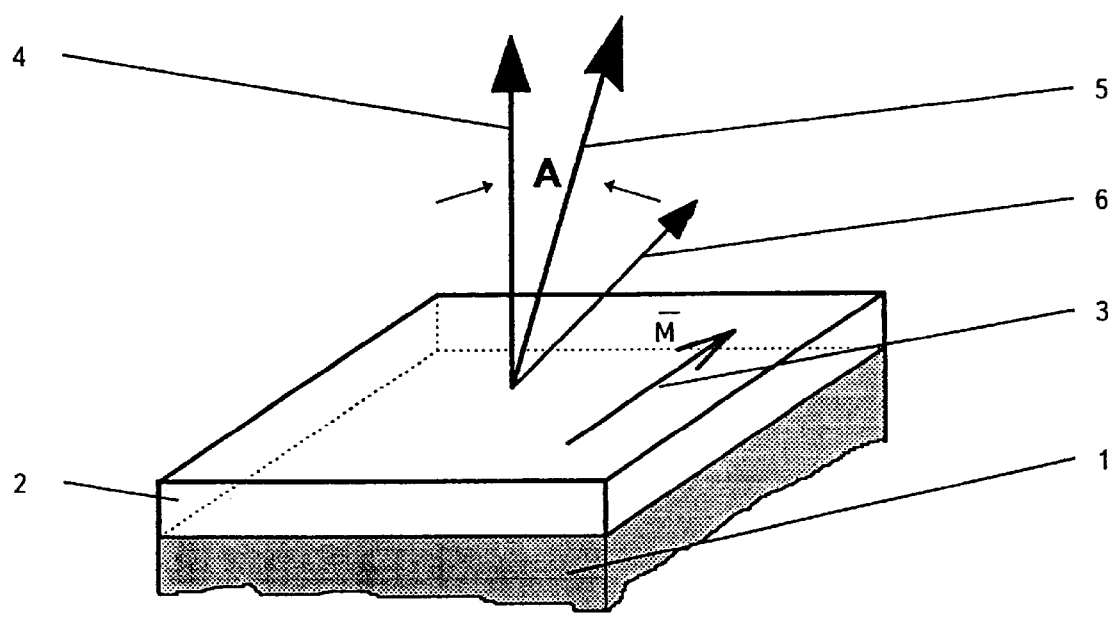
FIG. 3 is a schematic presentation of a magneto-optical structure according to the invention, illustrating orientation of the crystallographic axis.

As result of the research and experiments conducted by the inventors in order to learn the influence of changes in the orientation of the underlay on the anisotropy field $H_a$ and on the sensitivity $Q_F/H_{1ext}$ it has been discovered, that the aforementioned orientation of the underlay, presented on FIG. 3, characterized by the angle A between perpendicular 4 to the of plane of the underlay 1 with the deposited film 2 and the crystallographic axis [100] 5 falling in the range within 4 deg as measured in direction of the crystallographic axis [210] 6 provides best results in the aspect of sensitivity $Q_F/H_{1ext}$. When increasing the underlay 1 orientation angle A from 0 deg to 4 deg, inclusive, anisotropy field gradually decreases and sensitivity $Q_F/H_{1ext}$ rapidly raises. With further deflection of the underlay orientation beyond 4 deg, the top layer of the ferrite-garnet film changes magnetization direction to perpendicular to the film plane. In particular, with the magnitude of deflection from orientation [100] equal to 6 deg the epitaxial mono-crystalline film in its entire thickness becomes magnetized along a single axis and the "labyrinth" domain structure appears (FIG. 1), as in the usual ferrite-garnet films of the [111] orientation.

Figure 1:
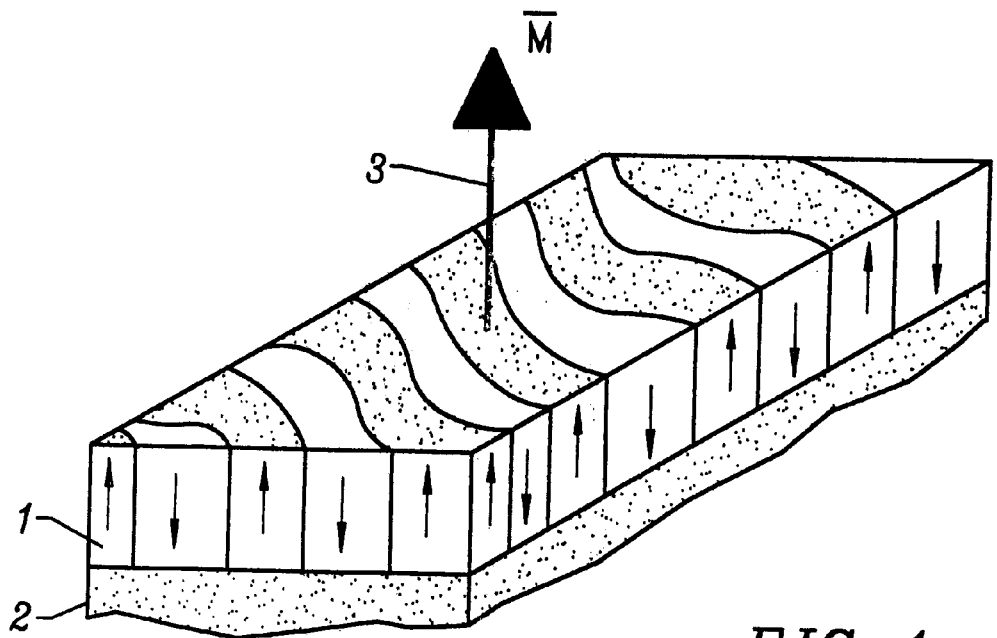
FIG. 1 is an illustration of the aforementioned "labyrinth" domain structure in a thin-film magneto-optical structure with magnetization vector perpendicular to the plane of magnetic material film.
Figure 2:
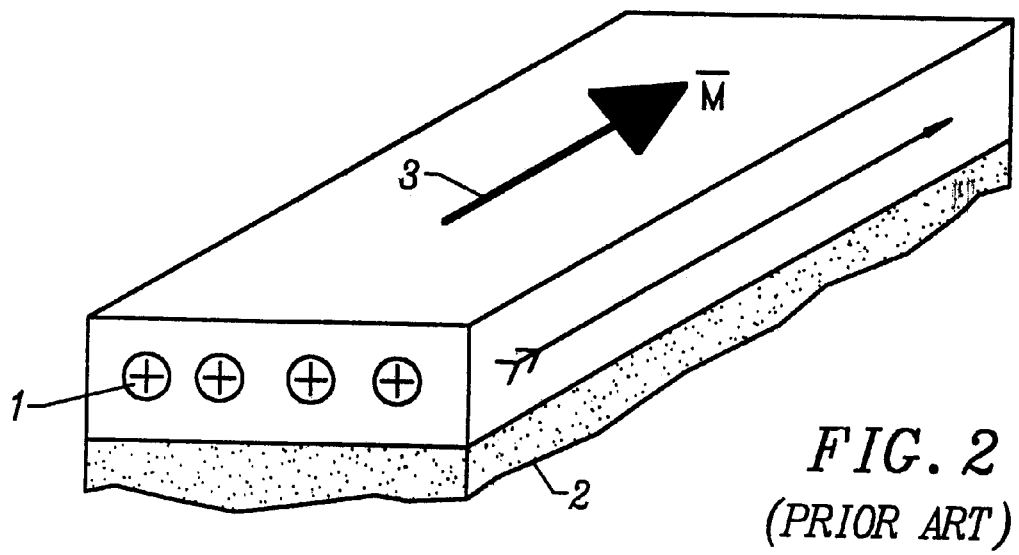
FIG. 2 is an schematic presentation of a known thin-film magneto-optical structure with magnetization vector lying in the plane of the magnetic material film.

The orientation angle of magnetization $M_s$ vector 3 of film 2 measured from a perpendicular direction to a position within film 2 plane, i.e. from the orientation of magnetization $M_s$ vector 3 shown on FIG. 1 towards its orientation shown on FIG. 2, also depends on the number of bismuth and gallium ions in the composition of the mono-crystalline layer and on the conditions of the film growth and methods of the film growth or deposition. When the content of gallium is less than 1.1 ion per one formulary unit of the mono-crystalline structure the saturation magnetization becomes large ($4PM_s>200$ Gauss). In such case, magnetic Q factor of the film drops (Q-factor<1), sensitivity drops sharply and higher values of $H_{1ext}$ are needed in order to defect the $M_s$ vector from the [100] direction. Increasing the number of gallium ions beyond 1.15 ions per one formulary unit ($4PM_s\sim=70$ Gauss) the magnetic Q factor becomes greater than 1, and vector $M_s$ is in a position perpendicular to the film plane ("labyrinth" domain structure). A limitation of bismuth content is a result of the requirement of greater values of the Faraday rotation coefficient, and is determined by the values of $H_a$ and $4PM_s$. At less than 0.8 ions per one formulary unit the films have low values of $Q_F$. This disadvantage is directly related to the content of bismuth in the crystalline lattice. However, when the bismuth content becomes higher than 0.85 ions per one formulary unit, the $a_F$ parameter of the lattice becomes higher than the $a_S$ parameter of the underlay lattice, and that causes significant stress anisotropy along the plane determined by the crystallographic axis [100], and sensitivity of the films deceases. At the same time, magneto-optical Q factor $Q_F$/alpha, where alpha is optical amplification, also goes down.

Example of a substantial implementation.

According to the invention, a magneto-optical structure has been formed, which consisted of an underlay on which thin epitaxial films have been grown according to the composition $RE_{3.0-0.81}Bi_{0.81}Fe_{3.85}Ga_{1.15}O_{12.0}$ where RE—rare-earth elements.

The films were grown by the way of liquid phase epitaxy on a mono-crystalline GGG underlay. The above determined deflection angle of the underlay orientation with respect to the crystallographic axis [100] varied in the range between 0 deg and 6 deg, and further away an underlay with orientation [210] was used.

Mono-crystalline films were grown with the following ratios of the alloy components:

$R_1=RE_2O_3/Fe_2O_3=34.0$ $R_2=Fe_2O_3/Ga_2O_3=6.47$ $R_3=PbO/Bi_2O_3=1.0$ $R_4=0.095$ $R_5=PbO/B_2O_3=4.17$

Growth temperature 720 deg C.

Underlay rotational speed 120 rev/min.

Thickness of the films 3.0 micrometers.

The films according to the composition presented above had the following optimal parameters:

at $H_{1ext}=20$ E sensitivity equal 0.55 angle deg/micrometer at $H_{1ext}=100$ E sensitivity equal 0.65 angle deg/micrometer The following table reports parameters of films according to the above position grown on underlays with various deflection angles of the orientation with respect to the plane determined by the crystallographic axis [100].

| Deflection angle of orientation (deg) | Position of $M_s$ vector | $Q_F$(deg/mm) at $H_{1ext}$ = 20 E | $Q_F$(deg/mm) at $H_{1ext}$ = 150 E | Resolution (mm) |
|---|---|---|---|---|
| 0,[100] | In the film plane | 0.2 | 0.38 | 0.45 |
| 1 | as above | 0.44 | 0.53 | 0.45 |
| 3 | as above | 0.48 | 0.56 | 0.45 |
| 4 | as above | 0.55 | 0.65 | 0.45 |
| 6 | Perpendicular in the range of the film sub-layer | 0.62 | 0.68 | >1.5 |
| [210] | Perpendicular to the film plane | labyrinth domain structure | labyrinth domain structure | >2 |

The results reported in the table show that position of the magnetization vector M along the film plane is preserved up to the value of the deflection angle between perpendicular to the underlay plane and the crystallographic axis [100], equal 4 deg, inclusive. At the value of the angle equal 6 deg a sub-layer appears, beginning at the open surface of the film, which has a magnetization vector M, perpendicular to the film plane. Further increase of the angle in direction of the [210] axis leads to the film having across its entire thickness vector M perpendicular to the film plane.

The following are various sources of information on the topic of the invention:
1. Scott G. B., IEEE Transactions on Magnetics, Vol. MAG-12, No.4, pp.292–310, 1976.
2. Tolksdorf W., Thin Solid Films, Vol.114, No.1–2, pp.33–43, 1984.
3. Gualtieri D. M. and Tumelty P. F., J.Appl.Phys. 57(1), Apr. 15, 1985, pp.3879–3881.
4. Gusev M. Y., Publications in [Journal of Phycisists Society], Vol.14, No.18, pp.1659–1662, 1988.
5. T. Mizumoto at al., IEEE Transactions on Magnetics., Vol. 29, No.6, November 1993, pp.3417–3419.

We claim:

1. A magneto-optical thin film structure, having an underlay of a dielectric material with garnet structure, on which a film of magnetic material is deposited having a magnetization vector which lies in the plane of the film, and wherein a bismuth containing gallium ferrite-garnet is chosen as the magnetic material of the film, characterized in that the underlay is formed from a mono-crystalline gadolinium-gallium garnet, having a crystallographic axis[100] which is offset with respect to a line drawn perpendicular to the underlay plane by the angle A which offset does not exceed the magnitude of deflection of the crystallographic axis [210] as measured from said perpendicular line, further characterized in that the angle A between the crystallographic axis [100] of the mono-crystalline underlay and the line drawn perpendicular to the plane of the underlay, measured from said perpendicular line in the direction of the crystallographic axis [210] of the underlay mono-crystal, is chosen in the range $0\ deg<A<=4\ deg$, and wherein the bismuth containing gallium ferrite-garnet is doped with rare-earth elements.

2. A structure according to claim 1, characterized in, that the magnetic material of the film contains from 0.80 to 0.85 ions of bismuth and from 1.1 to 1.15 ions of gallium per formulary unit of crystalline structure of said material.

3. A structure according to claim 1, characterized in that elements from the group comprised of thulium, lutetium, and gadolinium used separately or their combinations are chosen as the doping rare-earth elements.

4. A structure according to claim 3, characterized in, that the magnetic material of the film contains from 0.80 to 0.85 ions of bismuth and from 1.1 to 1.15 ions of gallium per formulary unit of crystalline structure of said material.

* * * * *

UNITED STATES PATENT AND TRADEMARK OFFICE
CERTIFICATE OF CORRECTION

PATENT NO.     : 6,143,435
DATED          : November 7, 2000
INVENTOR(S)    : II" Yashenko et al.

It is certified that error appears in the above-identified patent and that said Letters Patent is hereby corrected as shown below:

<u>Title page,</u>
Item [73], Assignee, replace "Garnatec, Berkshire, United Kingdom" with
-- Garnetec, Berkshire, United Kingdom --

Signed and Sealed this

Fourth Day of January, 2005

JON W. DUDAS
*Director of the United States Patent and Trademark Office*